US011621262B2

United States Patent
Liou et al.

(10) Patent No.: US 11,621,262 B2
(45) Date of Patent: Apr. 4, 2023

(54) DUAL-DIRECTIONAL SILICON-CONTROLLED RECTIFIER

(71) Applicant: Powerchip Semiconductor Manufacturing Corporation, Hsinchu (TW)

(72) Inventors: Juin Jei Liou, New Taipei (TW); Feibo Du, Sichuan (CN); Ching-Sung Ho, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 240 days.

(21) Appl. No.: 17/210,520

(22) Filed: Mar. 24, 2021

(65) Prior Publication Data

US 2022/0271029 A1 Aug. 25, 2022

(30) Foreign Application Priority Data

Feb. 23, 2021 (CN) .......................... 202110200794.6

(51) Int. Cl.
*H01L 27/02* (2006.01)
(52) U.S. Cl.
CPC ................ *H01L 27/0262* (2013.01)
(58) Field of Classification Search
None
See application file for complete search history.

(56) References Cited

U.S. PATENT DOCUMENTS 7,906,812 B2    3/2011  Vinson
8,466,489 B2    6/2013  Salcedo et al.

| 8,946,766 B2 | 2/2015 | Di Sarro et al. | |
|---|---|---|---|
| 2007/0004150 A1* | 1/2007 | Huang | H01L 27/0259 257/355 |
| 2011/0042716 A1* | 2/2011 | Lai | H01L 27/0266 257/E29.174 |
| 2012/0068299 A1* | 3/2012 | Lin | H01L 29/8613 257/E27.12 |

(Continued)

FOREIGN PATENT DOCUMENTS

CN          202394974        8/2012

OTHER PUBLICATIONS

Feibo Du, et al., "A Compact and Self-Isolated Dual-Directional Silicon Controlled Rectifier (SCR) for ESD Applications", IEEE Transactions On Device and Materials Reliability, vol. 19, No. 1, Jan. 22, 2019, pp. 169-175.

*Primary Examiner* — Bilkis Jahan

(74) *Attorney, Agent, or Firm* — JCIPRNET

(57) ABSTRACT

A dual-directional silicon-controlled rectifier includes: a substrate, a well region, a shallow trench isolation structure, heavily doped regions of a first conductive type, heavily doped regions of a second conductive type, and ESD implantations of the first conductive type. Four active regions are provided side by side in the well region. Forward and reverse SCRs and the ESD implantations are provided in the middle active regions. Forward and reverse diodes are provided in the active regions on both sides. One of the heavily doped regions of the first conductive type in contact with the ESD implantations is disposed between the SCRs and the diodes, so as to be electrically connected to a heavily doped region of the second conductive type of the diodes.

8 Claims, 10 Drawing Sheets

(56) References Cited

U.S. PATENT DOCUMENTS

2015/0236011 A1* 8/2015 Wang ..................... H01L 29/87
                                                    257/173
2017/0069618 A1* 3/2017 Altolaguirre ....... H01L 27/0292

* cited by examiner

DUAL-DIRECTIONAL SILICON-CONTROLLED RECTIFIER

CROSS-REFERENCE TO RELATED APPLICATION

This application claims the priority benefit of China application serial no. 202110200794.6, filed on Feb. 23, 2021. The entirety of the above-mentioned patent application is hereby incorporated by reference herein and made a part of this specification.

BACKGROUND

Technical Field

The present disclosure relates to the technical field of semiconductor electrostatic protection, and in particular to a low-voltage and compact dual-directional silicon-controlled rectifier (simply referred to as LVCDDSCR).

Description of Related Art

With the continuous development of the integrated circuit technology, electrostatic discharge (ESD) events may cause more and more serious damage to chips, which has severely restricted the reliability of semiconductor products. Therefore, providing effective on-chip ESD protection design for the chips becomes an issue to work on. In a specific ESD protection design for a chip, it is usually encountered that both positive and negative operating voltages are present at some I/O ports, and at this time, dual-directional ESD protection is necessary. Among the many available ESD protection devices, a dual-directional silicon-controlled rectifier (DDSCR) has high protection capabilities, relatively low on-resistance and parasitic capacitance, and is therefore very suitable for providing dual-directional ESD protection.

However, in a conventional DDSCR structure, it is usually necessary to dispose an isolation structure, that is, a deep N-well is configured to isolate two P-wells from a P-type substrate in a device to prevent the device from being short-circuited by a substrate diode during reverse operation. In advanced technology, the above-mentioned deep N-well further evolves into a buried region. At this time, for effective isolation, it is also necessary to provide a lateral N-well isolation ring structure for the DDSCR. The existence of the isolation structure in the DDSCR device greatly increases the layout area of the device, thereby equivalently reducing the area efficiency of the device.

In order to eliminate the dependence of the conventional DDSCR device on the complex isolation structure, existing studies have proposed a compact self-isolated DDSCR device. As shown in FIG. 1A, a shallow trench isolation (STI) structure is used in a P-type substrate 100 in which an N-type well region 102 is divided into two active regions. One of the active regions includes an N+ doped region 104a and a P+ doped region 106a, and a P-ESD implantation 108a in advanced CMOS technology functions as a replacement for the P-well of the conventional DDSCR. The other active region similarly includes an N+ doped region 104b, a P+ doped region 106b, and a P-ESD implantation 108b. Therefore, dual-directional ESD protection may be achieved in one N-type well region 102, thereby greatly reducing the device area and improving the area efficiency.

However, it can be seen from the equivalent circuit diagram of FIG. 1B that the compact self-isolated DDSCR device is not optimized for trigger paths. As such, when an ESD pulse is applied, the device can only be triggered by a common emitter collector junction avalanche breakdown voltage ($BV_{CEO}$) of an internal parasitic PNP transistor (that is, $PNP_1$ in FIG. 1B), thus generating a relatively large trigger voltage. With the continuous shrinking of nodes in the integrated circuit technology, an ESD design window (which defines an operating region of an ESD protection circuit) is continuously reduced. As a result, in the above-mentioned compact self-isolated DDSCR device, due to excessively high trigger voltage, discharge of ESD charges is less likely to be completed before a failure occurs in the internal circuit of the chip, and the reliability of the chip is challenged.

SUMMARY

The present disclosure is directed to a dual-directional silicon-controlled rectifier for dual-directional and low-voltage protection, by which a trigger voltage of a device in forward and reverse operation modes can be greatly reduced.

According to an embodiment of the present disclosure, a dual-directional silicon-controlled rectifier includes: a substrate of a first conductive type, a well region of a second conductive type, a shallow trench isolation structure, six heavily doped regions of the first conductive type, six heavily doped regions of the second conductive type, and four ESD implantations of the first conductive type. The shallow trench isolation structure is formed in the substrate, and divides the well region into a first active region, a second active region, a third active region, and a fourth active region side by side.

In the second active region, there are a first heavily doped region of the first conductive type, a first heavily doped region of the second conductive type, a second heavily doped region of the first conductive type, and a first ESD implantation of the first conductive type. The first heavily doped region of the second conductive type is located between and separated by a distance from the first heavily doped region of the first conductive type and the second heavily doped region of the first conductive type. The first ESD implantation of the first conductive type is disposed at a bottom of the first heavily doped region of the second conductive type, the first heavily doped region of the first conductive type, and the second heavily doped region of the first conductive type. The first heavily doped region of the first conductive type is electrically connected to the first heavily doped region of the second conductive type.

In the third active region adjacent to the second active region, there are a third heavily doped region of the first conductive type, a second heavily doped region of the second conductive type, a fourth heavily doped region of the first conductive type, and a second ESD implantation of the first conductive type. The third heavily doped region of the first conductive type is adjacent to the first heavily doped region of the first conductive type. The second heavily doped region of the second conductive type is located between and separated by a distance from the third heavily doped region of the first conductive type and the fourth heavily doped region of the first conductive type. The second ESD implantation of the first conductive type is disposed at a bottom of the third heavily doped region of the first conductive type, the second heavily doped region of the second conductive type, and the fourth heavily doped region of the first conductive type. The third heavily doped region of the first conductive type is electrically connected to the second heavily doped region of the second conductive type.

In the first active region adjacent to the second active region, there are a fifth heavily doped region of the first conductive type, a third heavily doped region of the second conductive type, a fourth heavily doped region of the second conductive type, and a third ESD implantation of the first conductive type. The fifth heavily doped region of the first conductive type is in contact with the third heavily doped region of the second conductive type and is separated by a distance from the fourth heavily doped region of the second conductive type. The third ESD implantation of the first conductive type is disposed at a bottom of the fifth heavily doped region of the first conductive type and the fourth heavily doped region of the second conductive type. The fifth heavily doped region of the first conductive type is electrically connected to the third heavily doped region of the second conductive type, and the fourth heavily doped region of the second conductive type is electrically connected to the second heavily doped region of the first conductive type.

In the fourth active region adjacent to the third active region, there are a sixth heavily doped region of the first conductive type, a fifth heavily doped region of the second conductive type, a sixth heavily doped region of the second conductive type, and a fourth ESD implantation of the first conductive type. The sixth heavily doped region of the first conductive type is in contact with the fifth heavily doped region of the second conductive type and is separated by a distance from the sixth heavily doped region of the second conductive type. The fourth ESD implantation of the first conductive type is disposed at a bottom of the sixth heavily doped region of the first conductive type and the sixth heavily doped region of the second conductive type. The sixth heavily doped region of the first conductive type is electrically connected to the fifth heavily doped region of the second conductive type, and the sixth heavily doped region of the second conductive type is electrically connected to the fourth heavily doped region of the first conductive type.

The dual-directional silicon-controlled rectifier according to an embodiment of the present disclosure may further include at least one first external diode connected to a circuit between the fourth heavily doped region of the second conductive type and the second heavily doped region of the first conductive type.

The dual-directional silicon-controlled rectifier according to an embodiment of the present disclosure may further include at least one second external diode connected to a circuit between the sixth heavily doped region of the second conductive type and the fourth heavily doped region of the first conductive type.

In the dual-directional silicon-controlled rectifier according to an embodiment of the present disclosure, the first conductive type is a P type and the second conductive type is an N type.

In the dual-directional silicon-controlled rectifier according to an embodiment of the present disclosure, the first conductive type is an N type, and the second conductive type is a P type.

In the dual-directional silicon-controlled rectifier according to an embodiment of the present disclosure, the first heavily doped region of the first conductive type, the first ESD implantation of the first conductive type, the well region, the fifth heavily doped region of the second conductive type, and the sixth heavily doped region of the first conductive type constitute a parasitic PNP transistor. The fourth ESD implantation of the first conductive type and the sixth heavily doped region of the second conductive type constitute a forward diode. The parasitic PNP transistor and the forward diode form a first low-voltage auxiliary trigger path via the fourth heavily doped region of the first conductive type, the second ESD implantation of the first conductive type, and the third heavily doped region of the first conductive type.

In the dual-directional silicon-controlled rectifier according to an embodiment of the present disclosure, the third heavily doped region of the first conductive type, the second ESD implantation of the first conductive type, the well region, the third heavily doped region of the second conductive type, and the fifth heavily doped region of the first conductive type constitute a parasitic PNP transistor. The third ESD implantation of the first conductive type and the fourth heavily doped region of the second conductive type constitute a reverse diode. The parasitic PNP transistor and the reverse diode form a second low-voltage auxiliary trigger path via the second heavily doped region of the first conductive type, the first ESD implantation of the first conductive type, and the first heavily doped region of the first conductive type.

The dual-directional silicon-controlled rectifier according to an embodiment of the present disclosure may further include a salicide block (SAB) layer formed on a surface with no heavily doped region in the first active region, the second active region, the third active region, and the fourth active region.

Based on the above, the dual-directional silicon-controlled rectifier of the present disclosure may greatly reduce a trigger voltage of a device in forward and reverse operation modes through two low-voltage auxiliary trigger paths formed of diode strings. In addition, for different ESD design windows, the dual-directional silicon-controlled rectifier of the present disclosure may be flexibly adapted to various protection requirements by adjusting the number of diodes in the auxiliary trigger paths. Furthermore, the dual-directional silicon-controlled rectifier of the present disclosure may achieve dual-directional ESD protection in one N-well region while maintaining self-isolated, and may achieve high area efficiency.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
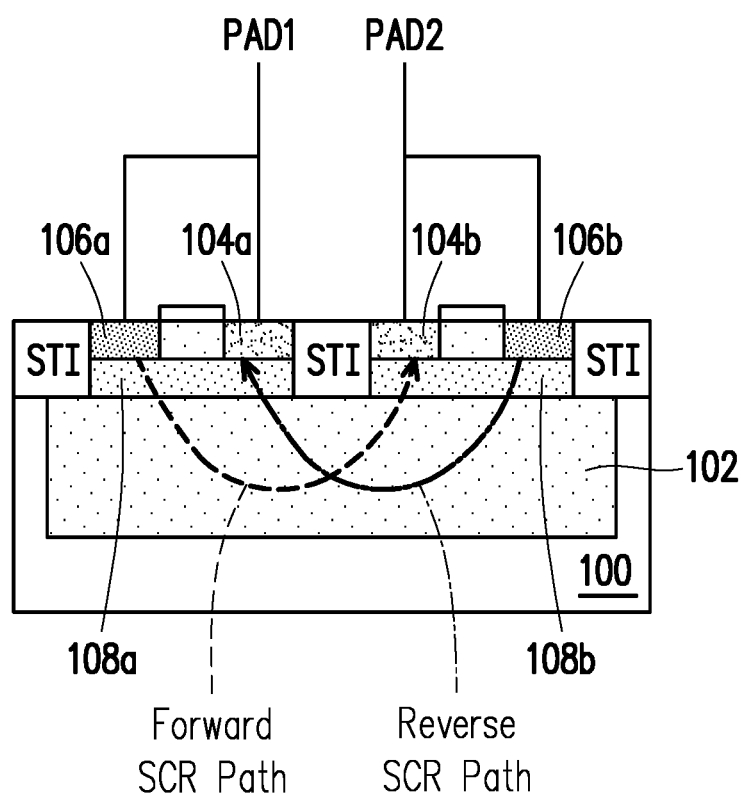
FIG. 1A is a structural cross-sectional diagram of an existing compact self-isolated DDSCR device.
Figure 1B:
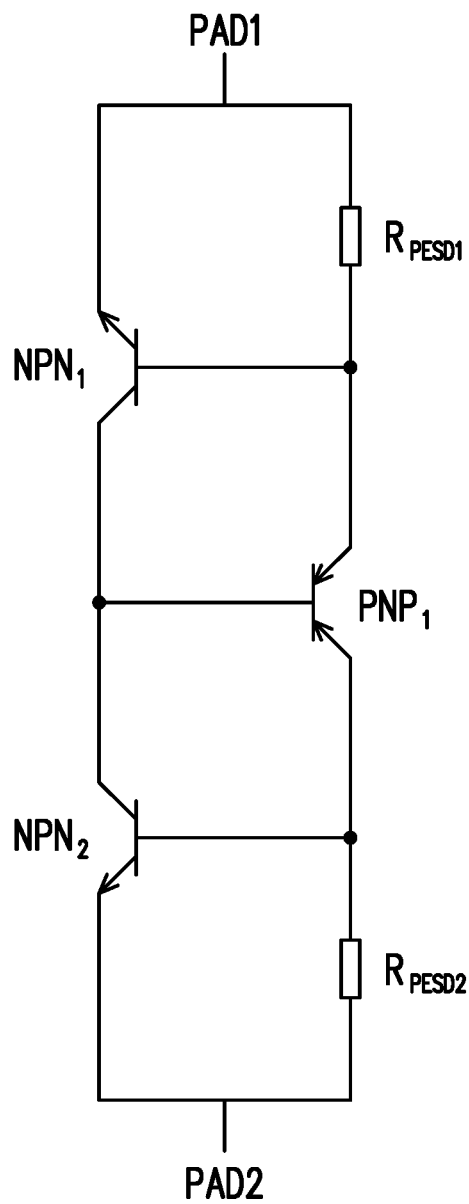
FIG. 1B is an equivalent circuit diagram of the compact self-isolated DDSCR device of FIG. 1A.

Hereinafter, embodiments of the present disclosure will be described in detail. However, these embodiments are illustrative, and the present disclosure is not limited thereto. In addition, the drawings are for illustrative purposes only, and are not drawn according to the original dimensions. Wherever possible, the same reference numerals are used in the drawings and the description to refer to the same or similar parts.

Figure 2A:
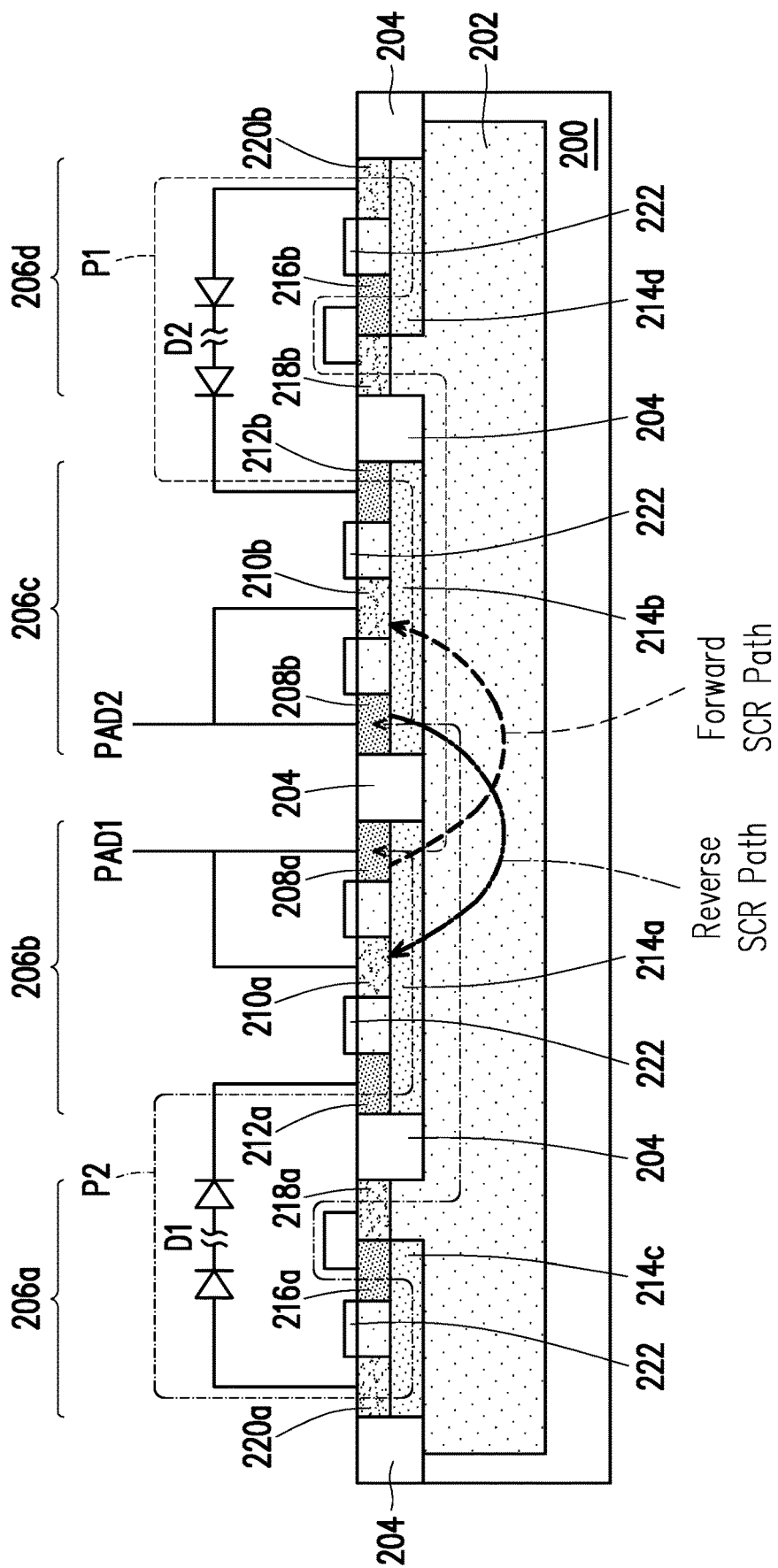
FIG. 2A is a structural cross-sectional diagram of a dual-directional silicon-controlled rectifier according to an embodiment of the present disclosure.

FIG. 2A is a structural cross-sectional diagram of a dual-directional silicon-controlled rectifier (DDSCR) according to an embodiment of the present disclosure.

Referring to FIG. 2A, the DDSCR according to the embodiment is a low-voltage and compact DDSCR (simply referred to as LVCDDSCR), including a substrate 200 of a first conductive type, a well region 202 of a second conductive type and a shallow trench isolation structure 204 formed in the substrate 200, a first heavily doped region 208a of the first conductive type, a first heavily doped region 210a of the second conductive type, a second heavily doped region 212a of the first conductive type, a first ESD implantation 214a of the first conductive type, a third heavily doped region 208b of the first conductive type, a second heavily doped region 210b of the second conductive type, a fourth heavily doped region 212b of the first conductive type, a second ESD implantation 214b of the first conductive type, a fifth heavily doped region 216a of the first conductive type, a third heavily doped region 218a of the second conductive type, a fourth heavily doped region 220a of the second conductive type, a third ESD implantation 214c of the first conductive type, a sixth heavily doped region 216b of the first conductive type, a fifth heavily doped region 218b of the second conductive type, a sixth heavily doped region 220b of the second conductive type, and a fourth ESD implantation 214d of the first conductive type. The shallow trench isolation structure 204 at least divides the well region 202 into a first active region 206a, a second active region 206b, a third active region 206c, and a fourth active region 206d side by side. However, the present disclosure is not limited thereto. Other active regions may be formed by division in the substrate 200 according to device design requirements. The "ESD implantation of the first conductive type" mentioned herein usually has a doping concentration between that of the well region 202 of the second conductive type and that of a heavily doped region (such as a heavily doped region of the first conductive type or a heavily doped region of the second conductive type).

In the second active region 206b, the first heavily doped region 210a of the second conductive type is located between and separated by a distance from the first heavily doped region 208a of the first conductive type and the second heavily doped region 212a of the first conductive type. The first ESD implantation 214a of the first conductive type is disposed at a bottom of the first heavily doped region 210a of the second conductive type, the first heavily doped region 208a of the first conductive type, and the second heavily doped region 212a of the first conductive type. In addition, the first heavily doped region 208a of the first conductive type is electrically connected to the first heavily doped region 210a of the second conductive type.

In the third active region 206c, the third heavily doped region 208b of the first conductive type is adjacent to the first heavily doped region 208a of the first conductive type disposed in the second active region 206b. The second heavily doped region 210b of the second conductive type is located between and separated by a distance from the third heavily doped region 208b of the first conductive type and the fourth heavily doped region 212b of the first conductive type. The second ESD implantation 214b of the first conductive type is disposed at a bottom of the third heavily doped region 208b of the first conductive type, the second heavily doped region 210b of the second conductive type, and the fourth heavily doped region 212b of the first conductive type. In addition, the third heavily doped region 208b of the first conductive type is electrically connected to the second heavily doped region 210b of the second conductive type.

In the first active region 206a adjacent to the second active region 206b, the fifth heavily doped region 216a of the first conductive type is in contact with the third heavily doped region 218a of the second conductive type, and is separated by a distance from the fourth heavily doped region 220a of the second conductive type. The third ESD implantation 214c of the first conductive type is disposed at a bottom of the fifth heavily doped region 216a of the first conductive type and the fourth heavily doped region 220a of the second conductive type. The fifth heavily doped region 216a of the first conductive type is electrically connected to the third heavily doped region 218a of the second conductive type. In FIG. 2A, the fourth heavily doped region 220a of the second conductive type is electrically connected to the second heavily doped region 212a of the first conductive type disposed in the second active region 206b. In addition, a first external diode D1 is further provided in a circuit between the fourth heavily doped region 220a of the second conductive type and the second heavily doped region 212a of the first conductive type.

In the fourth active region 206d adjacent to the third active region 206c, the sixth heavily doped region 216b of the first conductive type is in contact with the fifth heavily doped region 218b of the second conductive type, and is separated by a distance from the sixth heavily doped region 220b of the second conductive type. The fourth ESD implantation 214d of the first conductive type is disposed at a bottom of the sixth heavily doped region 216b of the first conductive type and the sixth heavily doped region 220b of the second conductive type. The sixth heavily doped region 216b of the first conductive type is electrically connected to the fifth heavily doped region 218b of the second conductive type. In FIG. 2A, the sixth heavily doped region 220b of the second conductive type is electrically connected to the fourth heavily doped region 212b of the first conductive type disposed in the third active region 206c. In addition, a second external diode D2 is further provided in a circuit between the sixth heavily doped region 220b of the second conductive type and the fourth heavily doped region 212b of the first conductive type.

In this embodiment, the first conductive type is a P type, and the second conductive type is an N type. However, the present disclosure is not limited thereto. In another embodiment, the first conductive type is the N type, and the second conductive type is the P type. In addition, the dual-directional silicon-controlled rectifier according to this embodiment further includes a salicide block layer 222 formed on a surface with no heavily doped region in each of the first active region 206a, the second active region 206b, the third active region 206c, and the fourth active region 206d. The salicide block layer 222 is configured to shield against metal silicides (not shown in the cross-sectional diagrams) between the active regions that are associated and are of different doping types from one another, thereby avoiding short circuits between the first active region 206a, the second active region 206b, the third active region 206c, and the fourth active region 206d.

Figure 2B:
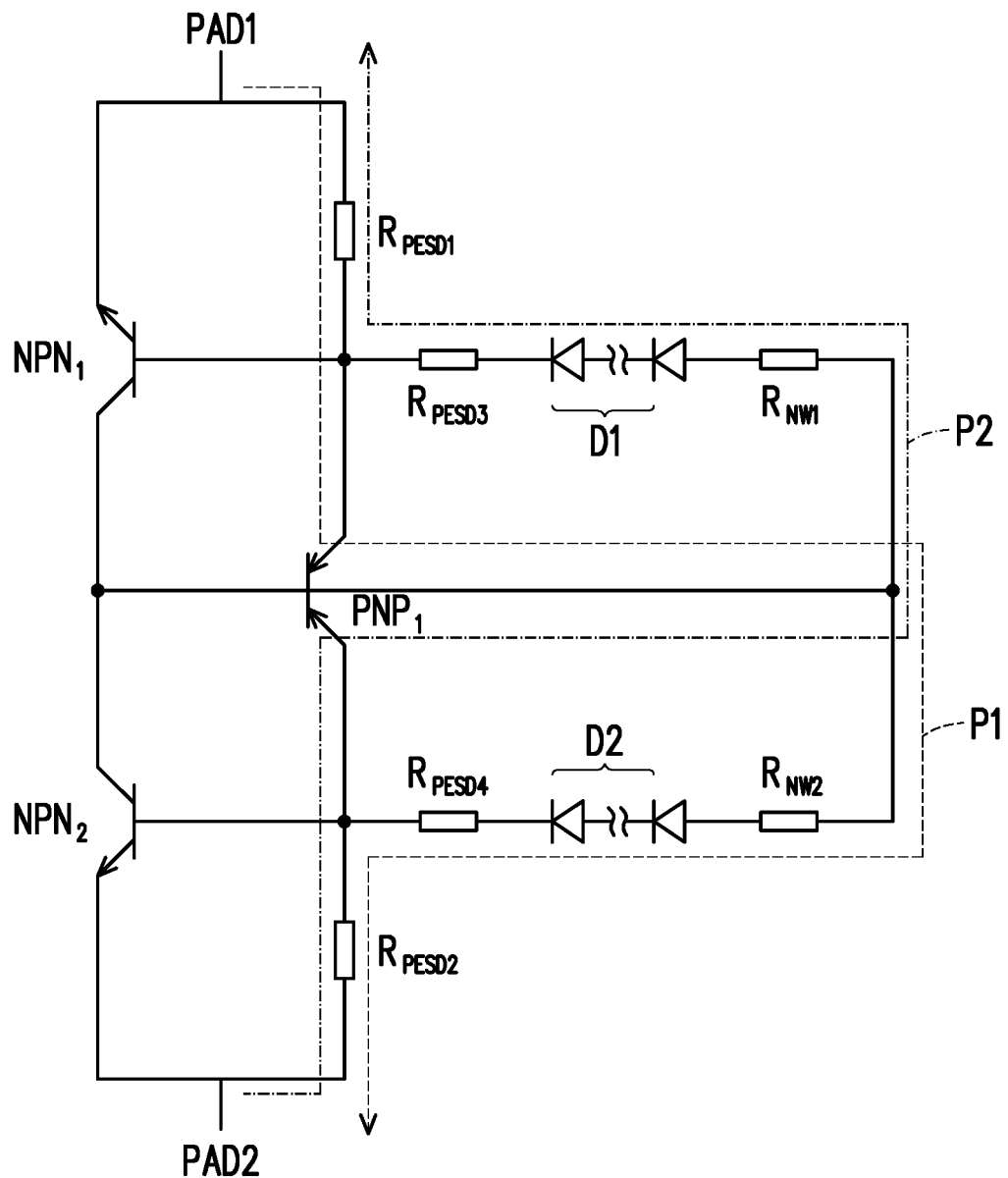
FIG. 2B is an equivalent circuit diagram of the dual-directional silicon-controlled rectifier of FIG. 2A.

FIG. 2B is an equivalent circuit diagram of the dual-directional silicon-controlled rectifier of FIG. 2A, in which the P type is the first conductive type and the N type is the second conductive type. Referring to FIG. 2A and FIG. 2B at the same time, when a forward ESD pulse is applied to an interface terminal PAD1 and an interface terminal PAD2 is grounded, the device first conducts a current through a "first low-voltage auxiliary trigger path P1" shown in FIG. 2A. The first heavily doped region 208a of the first conductive type, the first ESD implantation 214a of the first conductive type, the well region 202, the fifth heavily doped region 218b of the second conductive type, and the sixth heavily doped region 216b of the first conductive type constitute a parasitic PNP transistor ($PNP_1$ in FIG. 2B). The fourth ESD implantation 214d of the first conductive type and the sixth heavily doped region 220b of the second conductive type constitute a forward diode. Therefore, the parasitic PNP transistor and the forward diode (together with the second external diode D2) form the first low-voltage auxiliary trigger path P1 via the fourth heavily doped region 212b of the first conductive type, the second ESD implantation 214b of the first conductive type, and the third heavily doped region 208b of the first conductive type.

At this time, as shown in FIG. 2B, the $PNP_1$ is turned on, while a $NPN_1$ is not turned on. After that, as the current continues to increase, when the voltage at a resistor $R_{PESD2}$ drops to 0.7V, the $NPN_1$ is also turned on, and generates a positive current feedback with the $PNP_1$. Finally, a low-resistance current discharge path (that is, "Forward SCR Path" in FIG. 2A) is formed.

On the other hand, when the dual-directional silicon-controlled rectifier operates in a reverse mode, that is, the forward ESD pulse is applied to the PAD2 and the PAD1 is grounded, the same operation mechanism will apply. The third heavily doped region 208b of the first conductive type, the second ESD implantation 214b of the first conductive type, the well region 202, the third heavily doped region 218a of the second conductive type, and the fifth heavily doped region 216a of the first conductive type constitute the parasitic PNP transistor ($PNP_1$ in FIG. 2B). The third ESD implantation 214c of the first conductive type and the fourth heavily doped region 220a of the second conductive type constitute a reverse diode. Therefore, the parasitic PNP transistor and the reverse diode (together with the first external diode D1) form a second low-voltage auxiliary trigger path P2 via the second heavily doped region 212a of the first conductive type, the first ESD implantation 214a of the first conductive type, and the first heavily doped region 208a of the first conductive type. Therefore, in the reverse mode, the device first conducts a current through the "second low-voltage auxiliary trigger path P2" shown in FIG. 2A. At this time, as shown in FIG. 2B, the $PNP_1$ is turned on, while a $NPN_2$ is not turned on. After that, as the current continues to increase, when the voltage at a resistor $R_{PESD1}$ drops to 0.7V, the $NPN_2$ is also turned on, and generates a positive current feedback with the $PNP_1$. Finally, a low-resistance current discharge path (that is, "Reverse SCR Path" in FIG. 2A) is formed.

In the dual-directional silicon-controlled rectifier of the present disclosure, the relative positions of each diode of the first (forward) low-voltage auxiliary trigger path P1 and the second (reverse) low-voltage auxiliary trigger path P2, and the relative positions of the diodes and the main structure of the SCR may be changed (up, down, left, right) without changing the connection relationships between the circuits in FIG. 2B, and are not limited to those shown in the device structure shown in FIG. 2A.

Figure 3A:
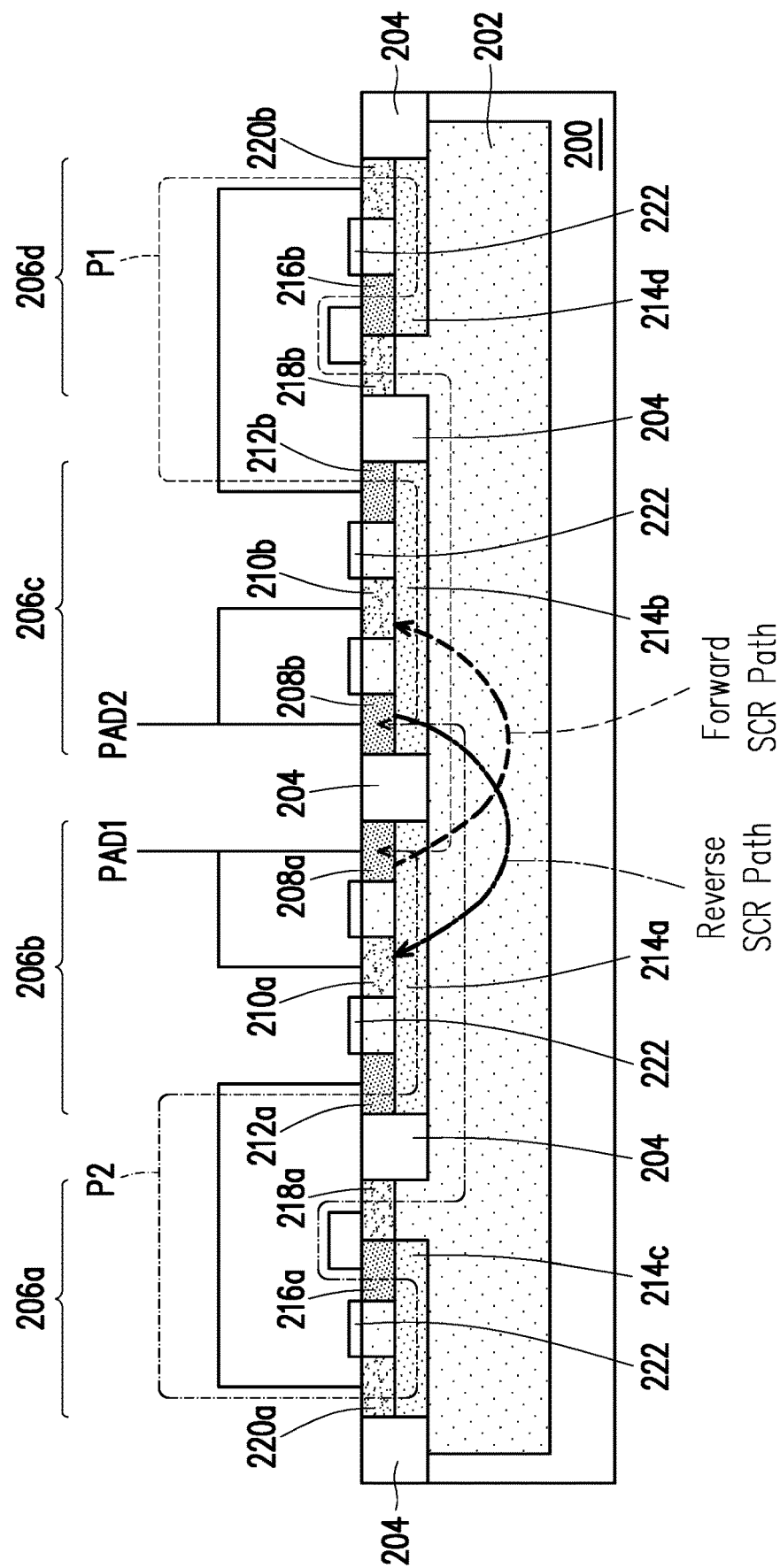
FIG. 3A is a structural cross-sectional diagram of a dual-directional silicon-controlled rectifier according to the embodiment of the present disclosure.
Figure 3B:
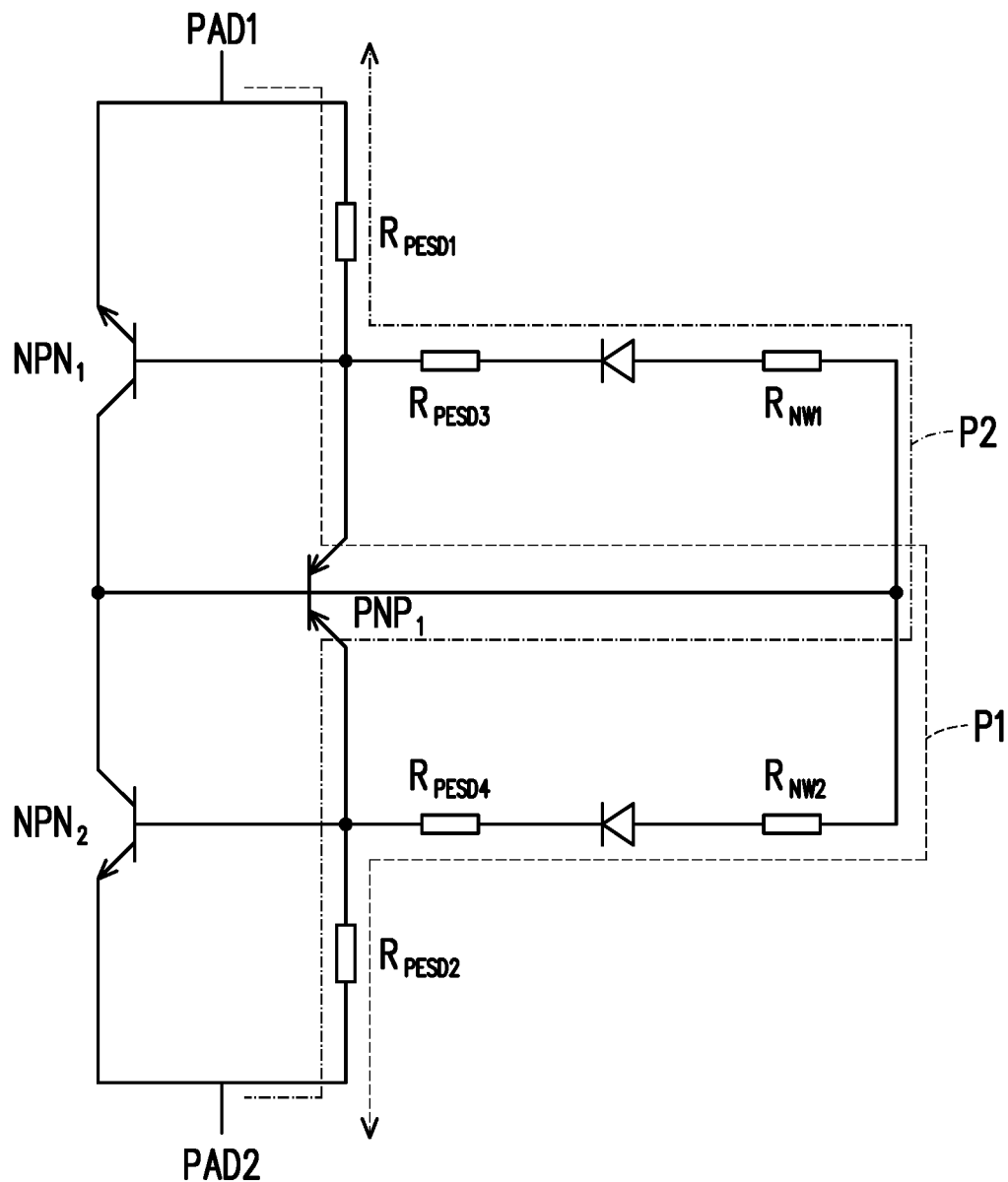
FIG. 3B is an equivalent circuit diagram of the dual-directional silicon-controlled rectifier of FIG. 3A.

In addition, for different ESD design windows, the dual-directional silicon-controlled rectifier may be flexibly adapted to various protection requirements by adjusting the number of the diodes in the low-voltage auxiliary trigger paths. For example, FIGS. 3A and 3B respectively show a structural cross-sectional diagram of a dual-directional silicon-controlled rectifier according to the above embodiment and an equivalent circuit diagram thereof. No external diodes (such as D1 and D2 in FIG. 2A) are provided. A forward diode is composed of only the fourth ESD implantation 214d of the first conductive type and the sixth heavily doped region 220b of the second conductive type, and a reverse diode is composed of only the third ESD implantation 214c of the first conductive type and the fourth heavily doped region 220a of the second conductive type. Furthermore, these two diodes and the parasitic PNP transistor constitute the first low-voltage auxiliary trigger path P1 and the second low-voltage auxiliary trigger path P2.

Figure 4A:
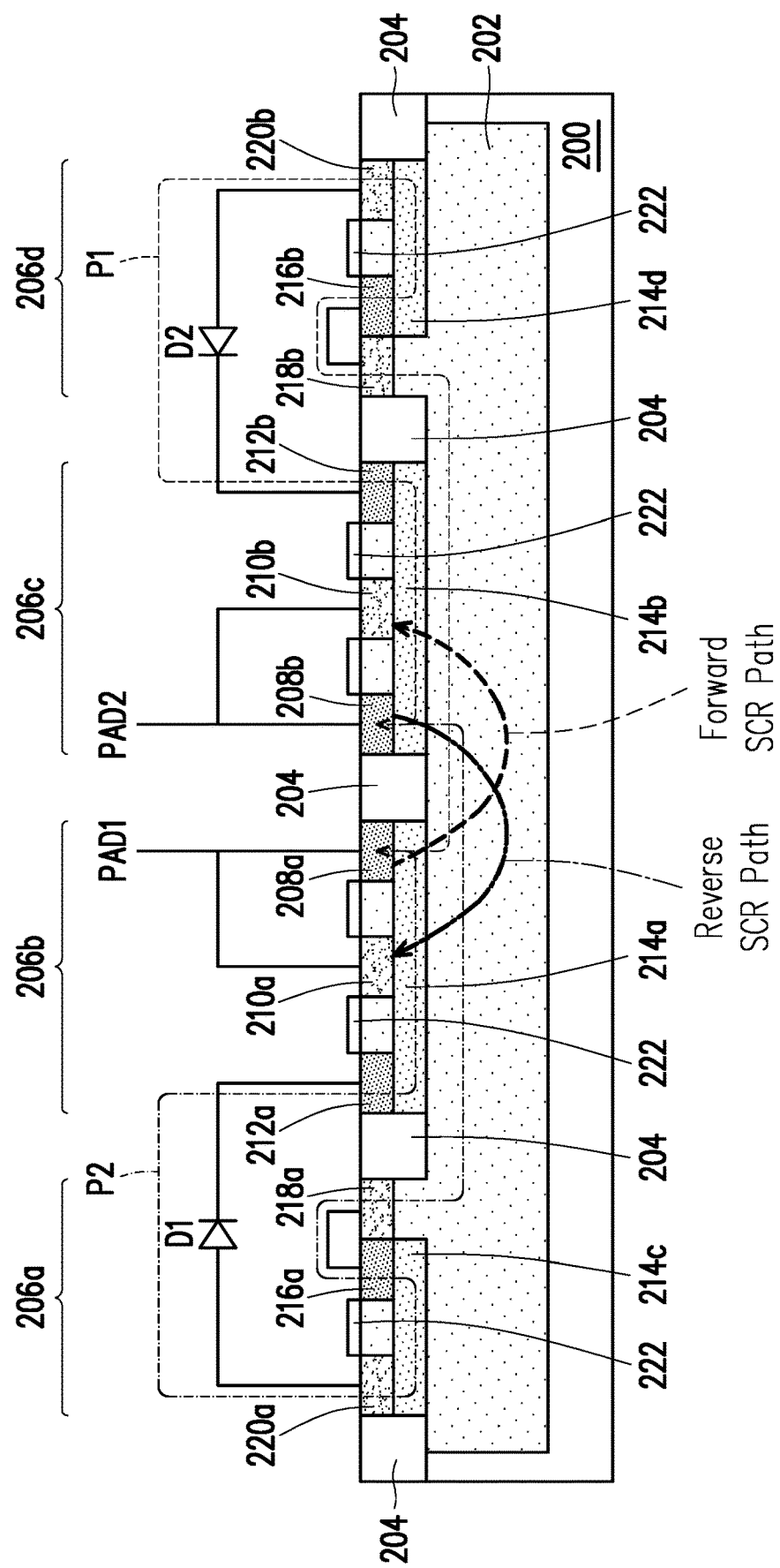
FIG. 4A is a structural cross-sectional diagram of another dual-directional silicon-controlled rectifier according to the embodiment of the present disclosure.
Figure 4B:
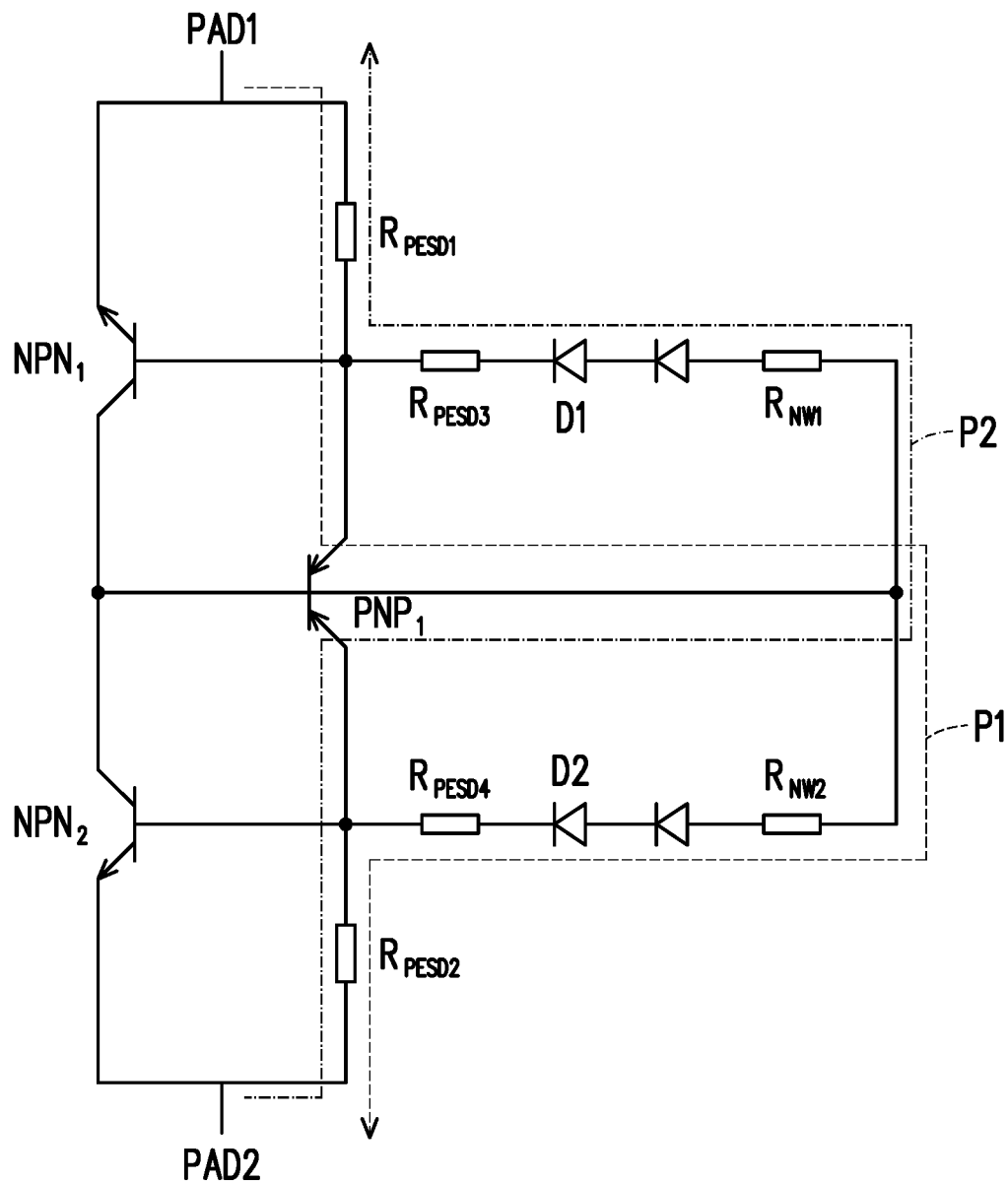
FIG. 4B is an equivalent circuit diagram of the dual-directional silicon-controlled rectifier of FIG. 4A.

FIGS. 4A and 4B respectively show a structural cross-sectional diagram of another dual-directional silicon-controlled rectifier according to the above embodiment and an equivalent circuit diagram thereof, in which one first external diode D1 and one second external diode D2 are provided.

Figure 5A:
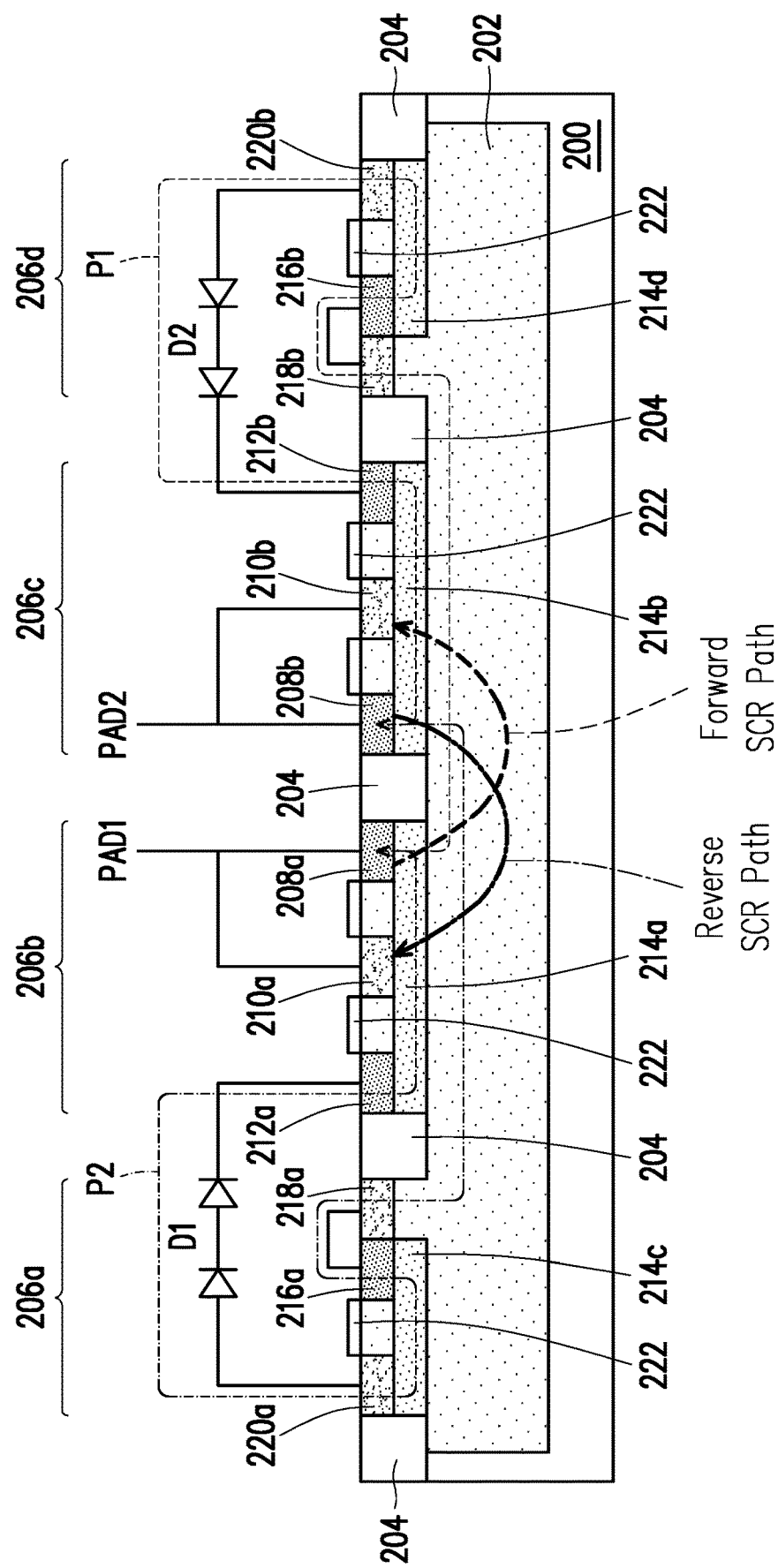
FIG. 5A is a structural cross-sectional diagram of still another dual-directional silicon-controlled rectifier according to the embodiment of the present disclosure.
Figure 5B:
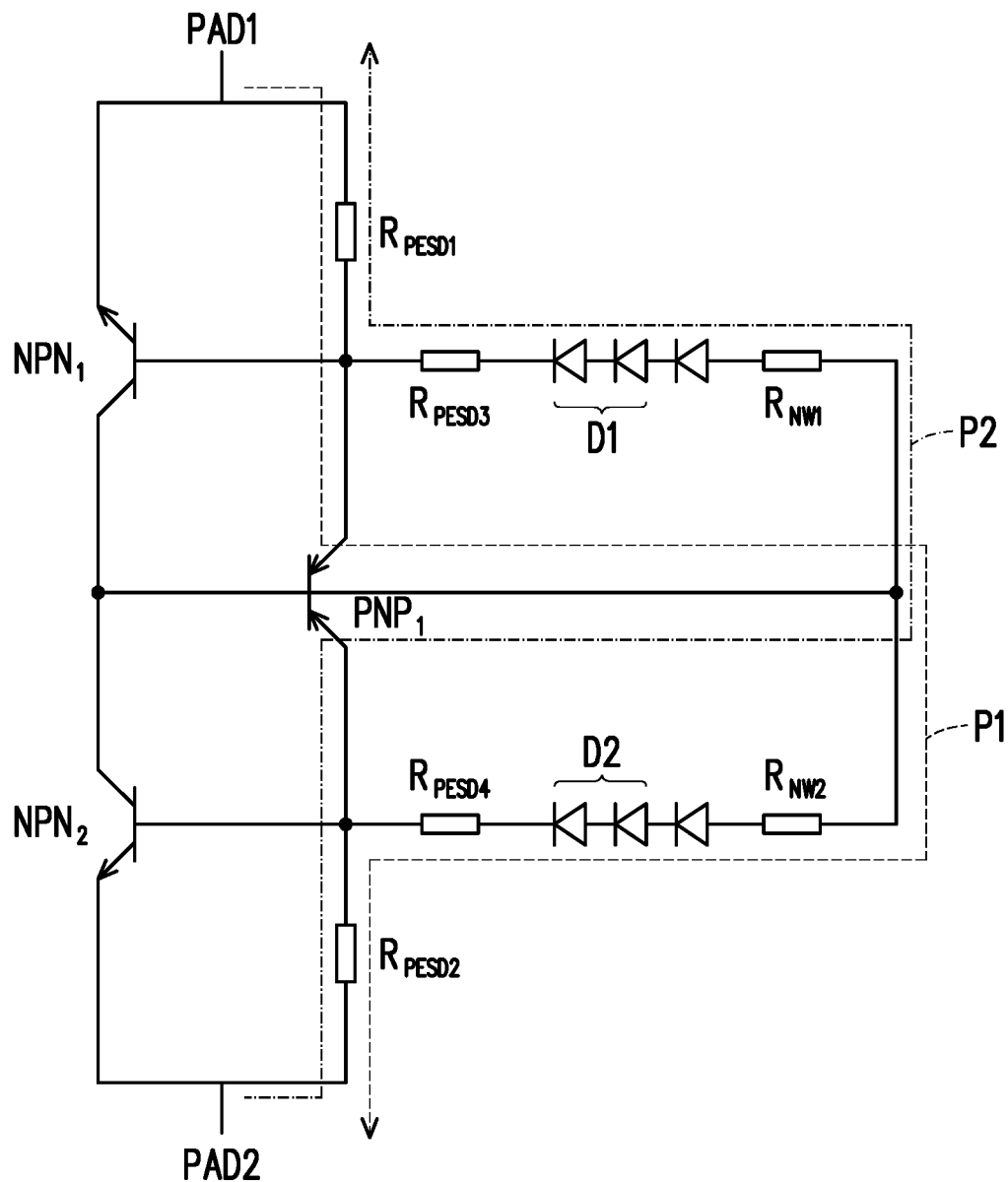
FIG. 5B is an equivalent circuit diagram of the dual-directional silicon-controlled rectifier of FIG. 5A.

FIGS. 5A and 5B respectively show a structural cross-sectional diagram of still another dual-directional silicon-controlled rectifier according to the above embodiment and an equivalent circuit diagram thereof, in which two first external diodes D1 and two second external diodes D2 are provided.

In summary, the dual-directional silicon-controlled rectifier of the present disclosure may greatly reduce a trigger voltage of a device in forward and reverse operation modes through two low-voltage auxiliary trigger paths formed by diode strings. In addition, for different ESD design windows, the dual-directional silicon-controlled rectifier of the present disclosure may be flexibly adapted to various protection requirements by adjusting the number of diodes in the auxiliary trigger paths. Furthermore, the dual-directional silicon-controlled rectifier of the present disclosure may achieve dual-directional ESD protection in one N-well region. Therefore, compared with the complex isolation structure in a conventional DDSCR device, the dual-directional silicon-controlled rectifier of the present disclosure may achieve high area efficiency.

It should be noted that the above embodiments are only used to illustrate, rather than limit, the technical solutions of the disclosure. Although the disclosure has been described in detail with reference to the foregoing embodiments, those of ordinary skill in the art should understand that they can still modify the technical solutions described in the foregoing embodiments, or make equivalent replacement of some or all of the technical features, and these modifications or replacements do not cause the essence of the corresponding technical solutions to deviate from the scope of the technical solutions of the embodiments of the disclosure.

What is claimed is:

1. A dual-directional silicon-controlled rectifier comprising:
   a substrate of a first conductive type;
   a well region of a second conductive type, formed in the substrate;
   a shallow trench isolation structure formed in the substrate and dividing the well region into a first active region, a second active region, a third active region, and a fourth active region side by side;
   a first heavily doped region of the first conductive type, a first heavily doped region of the second conductive type, a second heavily doped region of the first conductive type, and a first ESD implantation of the first conductive type, disposed in the second active region, wherein the first heavily doped region of the second conductive type is located between and separated by a distance from the first heavily doped region of the first conductive type and the second heavily doped region of the first conductive type, the first ESD implantation of the first conductive type is disposed at a bottom of the first heavily doped region of the second conductive type, the first heavily doped region of the first conductive type, and the second heavily doped region of the first conductive type, and the first heavily doped region of the first conductive type is electrically connected to the first heavily doped region of the second conductive type;
   a third heavily doped region of the first conductive type, a second heavily doped region of the second conductive type, a fourth heavily doped region of the first conductive type, and a second ESD implantation of the first conductive type, disposed in the third active region adjacent to the second active region, wherein the third heavily doped region of the first conductive type is adjacent to the first heavily doped region of the first conductive type, the second heavily doped region of the second conductive type is located between and separated by a distance from the third heavily doped region of the first conductive type and the fourth heavily doped region of the first conductive type, the second ESD implantation of the first conductive type is disposed at a bottom of the third heavily doped region of the first conductive type, the second heavily doped region of the second conductive type, and the fourth heavily doped region of the first conductive type, and the third heavily doped region of the first conductive type is electrically connected to the second heavily doped region of the second conductive type;
   a fifth heavily doped region of the first conductive type, a third heavily doped region of the second conductive type, a fourth heavily doped region of the second conductive type, and a third ESD implantation of the first conductive type, disposed in the first active region adjacent to the second active region, wherein the fifth heavily doped region of the first conductive type is in contact with the third heavily doped region of the second conductive type and is separated by a distance from the fourth heavily doped region of the second conductive type, the third ESD implantation of the first conductive type is disposed at a bottom of the fifth heavily doped region of the first conductive type and the fourth heavily doped region of the second conductive type, the fifth heavily doped region of the first conductive type is electrically connected to the third heavily doped region of the second conductive type, and the fourth heavily doped region of the second conductive type is electrically connected to the second heavily doped region of the first conductive type; and
   a sixth heavily doped region of the first conductive type, a fifth heavily doped region of the second conductive type, a sixth heavily doped region of the second conductive type, and a fourth ESD implantation of the first conductive type, disposed in the fourth active region adjacent to the third active region, wherein the sixth heavily doped region of the first conductive type is in contact with the fifth heavily doped region of the second conductive type and is separated by a distance from the sixth heavily doped region of the second conductive type, the fourth ESD implantation of the first conductive type is disposed at a bottom of the sixth heavily doped region of the first conductive type and the sixth heavily doped region of the second conductive type, the sixth heavily doped region of the first conductive type is electrically connected to the fifth heavily doped region of the second conductive type, and the sixth heavily doped region of the second conductive type is electrically connected to the fourth heavily doped region of the first conductive type.

2. The dual-directional silicon-controlled rectifier according to claim 1, further comprising: at least one first external diode connected to a circuit between the fourth heavily doped region of the second conductive type and the second heavily doped region of the first conductive type.

3. The dual-directional silicon-controlled rectifier according to claim 1, further comprising: at least one second external diode connected to a circuit between the sixth heavily doped region of the second conductive type and the fourth heavily doped region of the first conductive type.

4. The dual-directional silicon-controlled rectifier according to claim 1, wherein the first conductive type is a P type and the second conductive type is an N type.

5. The dual-directional silicon-controlled rectifier according to claim 1, wherein the first conductive type is an N type, and the second conductive type is a P type.

6. The dual-directional silicon-controlled rectifier according to claim 4, wherein the first heavily doped region of the first conductive type, the first ESD implantation of the first conductive type, the well region, the fifth heavily doped region of the second conductive type, and the sixth heavily doped region of the first conductive type constitute a parasitic PNP transistor, the fourth ESD implantation of the first conductive type and the sixth heavily doped region of the second conductive type constitute a forward diode, and the parasitic PNP transistor and the forward diode form a first low-voltage auxiliary trigger path via the fourth heavily doped region of the first conductive type, the second ESD implantation of the first conductive type, and the third heavily doped region of the first conductive type.

7. The dual-directional silicon-controlled rectifier according to claim 4, wherein the third heavily doped region of the first conductive type, the second ESD implantation of the first conductive type, the well region, the third heavily doped region of the second conductive type, and the fifth heavily doped region of the first conductive type constitute a parasitic PNP transistor, the third ESD implantation of the first conductive type and the fourth heavily doped region of the second conductive type constitute a reverse diode, and the parasitic PNP transistor and the reverse diode form a second low-voltage auxiliary trigger path via the second heavily doped region of the first conductive type, the first ESD implantation of the first conductive type, and the first heavily doped region of the first conductive type.

8. The dual-directional silicon-controlled rectifier according to claim 1, further comprising: a salicide block layer formed on a surface with no heavily doped region in the first active region, the second active region, the third active region, and the fourth active region.

* * * * *